(12) United States Patent
Lee et al.

(10) Patent No.: US 8,263,675 B2
(45) Date of Patent: Sep. 11, 2012

(54) PHOTOSENSITIVE RESIN COMPOSITION FOR COLOR FILTER AND COLOR FILTER MADE USING THE SAME

(75) Inventors: Kil-Sung Lee, Gwacheon (KR);
Jae-Hyun Kim, Seongnam (KR);
Chang-Min Lee, Goyang (KR);
Eui-June Jeong, Seoul (KR)

(73) Assignee: Cheil Industries Inc., Gumi-si (KR)

( * ) Notice: Subject to any disclaimer, the term of this patent is extended or adjusted under 35 U.S.C. 154(b) by 139 days.

(21) Appl. No.: 12/717,418

(22) Filed: Mar. 4, 2010

(65) Prior Publication Data
US 2010/0160474 A1    Jun. 24, 2010

Related U.S. Application Data

(63) Continuation-in-part of application No. PCT/KR2007/007034, filed on Dec. 31, 2007.

(30) Foreign Application Priority Data

Sep. 4, 2007 (KR) ........................ 10-2007-0089641

(51) Int. Cl.
*C08F 2/50* (2006.01)
*C08F 2/46* (2006.01)
*C08J 3/28* (2006.01)
*G03F 7/033* (2006.01)
*G03F 7/032* (2006.01)

(52) U.S. Cl. ........ 522/107; 522/100; 522/103; 522/104; 522/113; 522/123; 522/120; 522/71; 522/74; 522/81; 522/79; 522/101; 522/153; 522/149; 522/154; 522/178; 522/181; 522/182; 522/183; 522/80; 430/270.1; 430/281.1; 430/285.1; 430/286.1; 430/287.1; 430/293

(58) Field of Classification Search .................. 522/104, 522/103, 100, 101, 113, 120, 123, 149, 153, 522/154, 178, 181, 182, 183, 71, 74, 81, 522/79, 80; 430/281.1, 285.1, 286.1, 297.1, 430/293, 270.1
See application file for complete search history.

(56) References Cited

U.S. PATENT DOCUMENTS

| | | | |
|---|---|---|---|
| 6,042,991 A | 3/2000 | Aoai et al. | |
| 2003/0232259 A1 | 12/2003 | Araki | |

FOREIGN PATENT DOCUMENTS

| | | |
|---|---|---|
| CN | 1869816 | 11/2006 |
| EP | 1063247 A1 | 12/2000 |
| GB | 2012276 A | 7/1979 |
| JP | 54-098795 | 8/1979 |
| JP | 58-069856 | 4/1983 |
| JP | 07-172032 | 7/1995 |
| JP | 07-235655 | 9/1995 |
| JP | 10-066094 | 3/1998 |
| JP | 11-354763 | 12/1999 |
| JP | 2004-341121 | 12/2004 |
| JP | 2005-234385 | 9/2005 |
| JP | 2005-278213 | 10/2005 |
| JP | 2006-330209 | 12/2006 |
| JP | 2008-046269 | 2/2008 |
| KR | 1997-0076086 | 12/1997 |
| KR | 1998-0071479 | 10/1998 |
| KR | 10-0215878 B1 | 5/1999 |
| KR | 1020010022172 A | 3/2001 |
| KR | 1020010088315 A | 9/2001 |
| KR | 1020010088321 A | 9/2001 |
| KR | 10-2002-0039125 A | 5/2002 |
| KR | 10-2003-0002899 A | 1/2003 |
| KR | 1020030051197 A | 6/2003 |
| KR | 10-2003-0056596 A | 7/2003 |
| KR | 1020040026098 A | 3/2004 |
| KR | 10-2006-0052171 A | 5/2006 |
| TW | 583506 | 4/2004 |
| WO | 2009/031732 A1 | 5/2009 |

OTHER PUBLICATIONS

International Search Report and Written Opinion in counterpart International Application Serial No. PCT/KR2007/007034, dated May 29, 2008.

*Primary Examiner* — Sanza McClendon
(74) *Attorney, Agent, or Firm* — Summa, Additon & Ashe, P.A.

(57) ABSTRACT

The present invention relates to a photosensitive resin composition for a color filter and a color filter fabricated using the same. The photosensitive resin composition includes (a) an acrylic-based resin, (b) a photopolymerizable monomer, (c) a photopolymerization initiator, (d) a pigment, and (e) a solvent. The acrylic-based resin is a copolymer including a repeating unit of an ethylenic unsaturated monomer including a carboxyl group and a repeating unit of an ethylenic unsaturated monomer including an alkoxy 4-oxo butanoic acid group. The photosensitive resin composition for a color filter can have residue removing characteristics, and is capable of forming fine pixels and providing a color filter having high resolution.

18 Claims, 6 Drawing Sheets

PHOTOSENSITIVE RESIN COMPOSITION FOR COLOR FILTER AND COLOR FILTER MADE USING THE SAME

CROSS REFERENCE TO RELATED APPLICATIONS

This application is a continuation-in-part of International Application No. PCT/KR2007/007034, filed Dec. 31, 2007, pending, which designates the U.S., published as WO 2009/031732, and is incorporated herein by reference in its entirety, and claims priority therefrom under 35 USC Section 120. This application also claims priority under 35 USC Section 119 from Korean Patent Application No. 10-2007-0089641, filed in the Korean Intellectual Property Office on Sep. 4, 2007, which is also incorporated herein by reference in its entirety

FIELD OF THE INVENTION

The present invention relates to a photosensitive resin composition for a color filter, and an image sensor color filter fabricated using the same. More particularly, the present invention relates to a photosensitive resin composition for a color filter that is capable of forming a fine square-shaped pixel pattern and an image sensor color filter fabricated using the same.

BACKGROUND OF THE INVENTION

An image sensor is a device including several million elements for transforming light to an electrical signal, depending upon the intensity of radiation received by the device. The image sensor can be installed in a digital input device, which enables recording of pre-digitalized images to digitalized images. Recently, the need for these devices has remarkably increased for use in various security devices and digital porters.

The image sensor includes a pixel array, which is a plurality of pixels arranged in a two-dimensional matrix format. Each pixel includes photosensitive means and transmission and signal output devices. Depending upon the transmission and signal output devices, the image sensor is broadly classified into two kinds: a charge coupled device (CCD) type of image sensor and a complementary metal oxide semiconductor (CMOS) type of image sensor.

FIG. 4 illustrates a CMOS image sensor 100 to explain the role of a color filter in the image sensor. As an example, incoming light reaches a color filter 5 through a microlens 1 and a second overcoating layer (OCL) 3, and is separated into each of R, G, and B in the color filter 5. Then, the color filter transmits the light through a first overcoating layer (OCL) 7, a passivation layer 9, and an inter-metal dielectric layer (IMD) 11, and then to a photodiode 13 corresponding to each pixel formed on an interlayer dielectric layer (ILD) 15.

Photosensitive resin compositions for a liquid crystal display (LCD) color filter that are developed in an alkali aqueous solution developer have been actively studied. As the unit pixel is decreased in size from the conventional size of 5 to 3 µm to 1 µm or less to improve image quality of digital cameras, however, there is a need for improved photosensitive resin compositions.

For example, as the unit pixel is decreased in size to 1 µm or less, it is necessary to consider the geometric optic and wave optic aspects in relation to the microlens since the size of the unit pixel can be up to about 1.5 times the visible ray wavelength range.

More specifically, as the unit pixel is decreased in size, the diameter of each microlens is decreased. Therefore, unless the focal distance of each lens is decreased, the resolution is deteriorated by the crosstalk phenomenon between adjacent pixels. In order to solve these problems, an overcoating layer can be eliminated from the lower layer of the color filter to decrease the distance between the microlens and the photodiode, and the color filter can be formed on a passivation layer ($SiN_x$). Alternatively, the color filter may be formed on an inter-metal insulation layer from which the passivation layer is eliminated.

In this case, each RGB pixel deteriorates the pattern residues and resolution characteristics, unlike the case of manufacturing it on the conventional overcoating layer.

A device and method for an image sensor color filter are disclosed in Korean Patent Laid-Open Publication No. 2002-039125, Japanese Patent Laid-Open Publication Pyong 10-066094, Korean Patent Laid-Open Publication No. 1998-056215, Japanese Patent Laid-Open Publication Pyong 7-235655, Korean Patent Laid-Open Publication No. 2003-056596, Japanese Patent Laid-Open Publication No. 2005-278213, Korean Patent Laid-Open Publication No. 2003-002899, and Japanese Patent Laid-Open Publication Pyong 11-354763; and an image sensor color filter composition is disclosed in Korean Patent Laid-Open Publication No. 2006-0052171, Japanese Patent Laid-Open Publication No. 2004-341121, and Japanese Patent Laid-Open Publication Pyong 7-172032. Korean Patent Laid-Open Publication No. 2006-0052171 and Japanese Patent Laid-Open Publication No. 2004-341121 disclose a polymer having a double bond with a dye in order to provide a pixel having a high density, so that a 2.0×2.0 µm fine pattern may be provided. However, because the method uses a dye instead of a pigment as a colorant, there can be problems with regard to long-term reliability due to weak dye photo resistance and heat resistance. Furthermore, in Japanese Patent Laid-Open Publication Pyong 7-172032, a black matrix is introduced in order to prevent color mixing and seceding between each of R, G, and B pixels. However, this method needs an additional step to provide the black matrix, and it is substantially impossible to provide a black matrix having the required fine size. It also has a drawback of decreasing the aperture ratio due to introducing the black matrix.

SUMMARY OF THE INVENTION

An exemplary embodiment of the present invention provides a photosensitive resin composition for a color filter and an image sensor color filter fabricated using the same. Another embodiment of the present invention provides a photosensitive resin composition for a color filter capable of forming a fine pixel pattern of 1.2 µm or less and not producing pattern residues on a non-exposed part by providing an excellent developing property in an alkali developer as well as stabilizing a pigment dispersion.

Yet another embodiment of the present invention provides a color filter made using the photosensitive resin composition.

The embodiments of the present invention are not limited to the above technical purposes, and a person of ordinary skill in the art can understand other technical purposes.

According to one embodiment of the present invention, provided is a photosensitive resin composition for a color filter that includes: (a) an acrylic-based resin; (b) a photopolymerizable monomer; (c) a photopolymerization initiator; (d) a pigment; and (e) a solvent. The (a) acrylic-based resin is a copolymer including a repeating unit derived from an ethylenic unsaturated monomer including a carboxyl group and a repeating unit derived from an ethylenic unsaturated monomer including an alkoxy 4-oxo butanoic acid group.

According to another embodiment of the present invention, provided is a color filter patterned using the photosensitive resin composition for a color filter.

It is possible to provide a fine pixel having a size of 1.2×1.2 μm with the photosensitive resin composition for a color filter according to the present invention, which is able to provide an image sensor color filter with high resolution.

DETAILED DESCRIPTION OF THE INVENTION

Figure 1A:
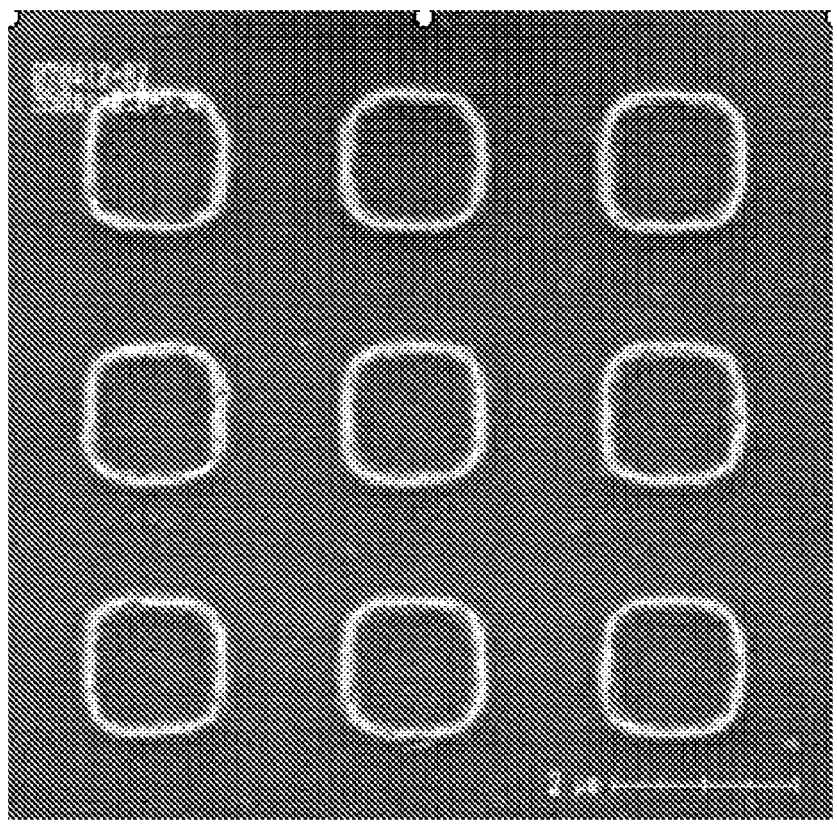
FIG. 1A is a photograph of a pixel fabricated using the photosensitive resin composition for a color filter according to Example 8.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

In the present specification, when a specific definition is not otherwise provided, "alkyl" refers to $C_1$-$C_4$ alkyl, "alkoxy" refers to $C_1$-$C_4$ alkoxy, "alkylene" refers to $C_1$-$C_{20}$ alkylene, "cycloalkylene" refers to substituted or unsubstituted $C_3$-$C_{18}$ cycloalkylene, "alkenylene" refers to $C_2$-$C_{20}$ alkenylene, "arylene" refers to $C_6$-$C_{30}$ arylene, and "divalent heterocycle" refers to substituted or unsubstituted divalent $C_2$-$C_{20}$ heterocycle including an element selected from the group consisting of oxygen, sulfur, nitrogen, phosphorous, and combinations thereof.

In the present specification, when a specific definition is not otherwise provided, the term "substituted" refers to one substituted with at least one substituent selected from the group consisting of halogen (F, Br, Cl, or I), hydroxyl, nitro, cyano, amino, azido, amidino, hydrazino, hydrazono, carbonyl, carbamyl, thiol, ester, carboxyl or a salt thereof, sulfonic acid or a salt thereof, phosphoric acid or a salt thereof, $C_1$-$C_{15}$ alkyl, $C_1$-$C_{20}$ alkoxy, $C_2$-$C_{16}$ alkenyl, $C_2$-$C_{16}$ alkynyl, $C_6$-$C_{18}$ aryl, $C_7$-$C_{18}$ arylalkyl, $C_1$-$C_{20}$ heteroalkyl, $C_2$-$C_{20}$ heterocycle, $C_3$-$C_{20}$ heteroaryl alkyl, $C_3$-$C_{15}$ cycloalkyl, $C_3$-$C_{15}$ cycloalkenyl, $C_6$-$C_{15}$ cycloalkynyl, and $C_3$-$C_{20}$ heterocycloalkyl.

In the present specification, when a specific definition is not otherwise provided, "hetero" refers to one including an element selected from the group consisting of oxygen, sulfur, nitrogen, phosphorus, and combinations thereof.

The photosensitive resin composition according to one embodiment of the present invention includes: (a) an acrylic-based resin; (b) a photopolymerizable monomer; (c) a photopolymerization initiator; (d) a pigment; and (e) a solvent. The acrylic-based resin is a copolymer including a repeating unit derived from an ethylenic unsaturated monomer including a carboxyl group and a repeating unit derived from an ethylenic unsaturated monomer including an alkoxy 4-oxo butanoic acid group.

In one embodiment, the photosensitive resin composition for a color filter includes: (a) 0.5 to 20 wt % of an acrylic-based resin; (b) 0.5 to 20 wt % of a photopolymerizable monomer; (c) 0.1 to 10 wt % of a photopolymerization initiator; (d) 0.1 to 50 wt % of a pigment dispersion; and (e) balance of a solvent.

Exemplary components included in photosensitive resin compositions for a color filter according to embodiments of the present invention will hereinafter be described in detail. However, these embodiments are only exemplary, and the present invention is not limited thereto.

(a) Acrylic-Based Resin

The acrylic-based resin is an alkali soluble resin including a repeating unit derived from an ethylenic unsaturated monomer including a carboxyl group and a repeating unit derived from an ethylenic unsaturated monomer including an alkoxy 4-oxo butanoic acid group.

The acrylic-based resin can be obtained by copolymerization of i) an ethylenic unsaturated monomer having an alkoxy 4-oxo butanoic acid group, ii) an ethylenic unsaturated monomer having a carboxyl group, and iii) an ethylenic unsaturated monomer that is copolymerizable with the ethylenic unsaturated monomer having the alkoxy 4-oxo butanoic acid group or a carboxyl group.

i) Ethylenic Unsaturated Monomer Having an Alkoxy 4-oxo Butanoic Acid Group

The ethylenic unsaturated monomer having an alkoxy 4-oxo butanoic acid group is a monomer having a $C_1$ to $C_4$ alkoxy 4-oxo butanoic acid group. Examples of the ethylenic unsaturated monomer having an alkoxy 4-oxo butanoic acid group include ethoxy 4-oxo butanoic methacrylate, ethoxy 4-oxo butanoic acrylate, propoxy 4-oxo butanoic methacrylate, propoxy 4-oxo butanoic acrylate, butoxy 4-oxo butanoic methacrylate, butoxy 4-oxo butanoic acrylate, and the like.

The acrylic-based resin includes a repeating unit derived from the ethylenic unsaturated monomer having an alkoxy 4-oxo butanoic acid group in an amount of 1 to 20 mol %. When added in an amount within the above range, the ethylenic unsaturated monomer having an alkoxy 4-oxo butanoic acid group can provide an appropriate acid value to the acrylic resin so that the developing property of the alkali developer is improved and the pigment dispersion is stabilized.

ii) Ethylenic Unsaturated Monomer Having a Carboxyl Group

The ethylenic unsaturated monomer having a carboxyl group is a monomer having a carboxyl group and examples thereof include at least one selected from the group consisting of acrylic acid, alkoxy 4-oxo butanoic acid, methacrylic acid, maleic acid, itaconic acid, and fumaric acid.

The acrylic-based resin includes a repeating unit derived from the ethylenic unsaturated monomer having a carboxyl group in an amount of 10 to 40 mol % along with the above repeating unit derived from the ethylenic unsaturated monomer having an alkoxy 4-oxo butanoic acid group. When the ethylenic unsaturated monomer having a carboxyl group is added in an amount within the above range, the acrylic-based resin can have an appropriate acid value so that the developing property to the alkali developer is improved and the pigment dispersion is stabilized.

iii) Ethylenic Unsaturated Monomer Copolymerizable with the Ethylenic Unsaturated Monomer Having the Alkoxy 4-oxo Butanoic Acid Group or a Carboxyl Group Examples of the ethylenic unsaturated monomer copolymerizable with the ethylenic unsaturated monomer having the alkoxy 4-oxo butanoic acid group or a carboxyl group include: vinyl aromatic compounds such as styrene, α-methylstyrene, vinyltoluene, and vinylbenzylmethylether; unsaturated carbonic acid esters such as methylacrylate, methylmethacrylate, ethylacrylate, ethyl methacrylate, butylacrylate, butyl methacrylate, 2-hydroxyethylacrylate, 2-hydroxyethylmethacrylate, 2-hydroxybutylacrylate, 2-hydroxybutylmethacrylate, benzyl acrylate, benzylmethacrylate, cyclohexylacrylate, cyclohexylmethacrylate, phenylacrylate, and phenylmethacrylate; unsaturated carbonic acid amino alkyl esters such as 2-aminoethyl acrylate, 2-aminoethylmethacrylate, 2-dimethylaminoethylacrylate, and 2-dimethylaminoethylmethacrylate; carbonic acid vinyl esters such as vinyl acetate and vinyl benzoate; unsaturated carbonic acid glycidyl esters such as glycidyl acrylate and glycidyl methacrylate; vinyl cyanide compounds such as acrylonitrile and methacrylonitrile; and unsaturated amides such as acrylamide and methacrylamide. The acrylic-based resin includes a repeating unit derived from one or more monomers described above.

A repeating unit derived from the ethylenic unsaturated monomer that is copolymerizable with the ethylenic unsaturated monomer having the alkoxy 4-oxo butanoic acid group or a carboxyl group is included in a balance amount in the acrylic-based resin. In one embodiment, the repeating unit may be included in an amount of 60 to 90 mol %.

The acrylic-based resin obtained from copolymerization of i) to iii) monomers may be exemplified by the structure of the following Formula 1.

[Chemical Formula 1]

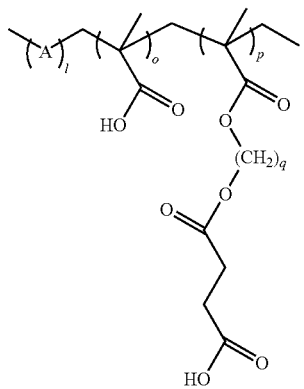

In the above Formula 1, A is a repeating unit derived from the iii) ethylenic unsaturated monomer that is copolymerizable with the ethylenic unsaturated monomer having the alkoxy 4-oxo butanoic acid group or a carboxyl group; l, o, and p represent a mole ratio (mol %) of each repeating unit; and q is an integer ranging from 1 to 4.

The (a) acrylic-based resin is a primary factor for determining the resolution of a pixel. The resolution of a pixel is significantly dependent upon the acid value and molecular weight of acrylic-based resins. Accordingly, the (a) acrylic-based resin has a weight average molecular weight ranging from 5000 to 60,000. According to another embodiment, the (a) acrylic-based resin has a weight average molecular weight ranging from 10,000 to 40,000. When the weight average molecular weight is less than 5000, the development can excessively progress so as to lose patterns. On the other hand, when the weight average molecular weight is more than 60,000, the development may not progress, so that the resin may not be patterned.

The (a) acrylic-based resin can also affect pixel resolution and pattern residue characteristics. When the (a) acrylic-based resin has both a carboxyl group and an alkoxy 4-oxo butanoic acid group instead of only a carboxyl group, it can improve pixel resolution and pattern residue characteristics and improve performance of the color filter. This is because the alkoxy 4-oxo butanoic acid group can provide an appropriate acid value so that it can facilitate the alkali development as well as stabilize the pigment dispersion. According to one embodiment, the (a) acrylic-based resin has an acid value ranging from 70 to 130 mg KOH/g. According to another embodiment, the (a) acrylic-based resin has an acid value ranging from 90 to 100 mg KOH/g.

According to one embodiment, the photosensitive resin composition includes the (a) acrylic-based resin in an amount of 0.5 to 20 wt % based on the total weight of the photosensitive resin composition. When the (a) acrylic-based resin is added in an amount within this range, it can improve the developing property in an alkali developer, so that the photosensitive resin composition can exhibit excellent cross-linking to decrease surface roughness.

(b) Photopolymerizable Monomer

The photopolymerizable monomer may be selected from the group consisting of glycerol methacrylate, ethylene glycol dimethacrylate, diethylene glycol dimethacrylate, triethylene glycol dimethacrylate, propylene glycol dimethacrylate, 1,4-butanediol dimethacrylate or 1,6-hexanediol dimethacrylate, ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol diacrylate, dipenta erythritol triacrylate, dipentaerythritol pentaacrylate, pentaerythritol hexaacrylate, bisphenol A diacrylate, trimethylolpropane triacrylate, novolac epoxy acrylate, and mixtures thereof.

In one embodiment, glycerol methacrylate obtained from a reaction of glycerol, acid anhydride, and glycidyl methacrylate is used as the photopolymerizable monomer.

For example, the glycerol methacrylate may be obtained by the reaction of the following Reaction Scheme 1.

[Reaction Scheme 1]

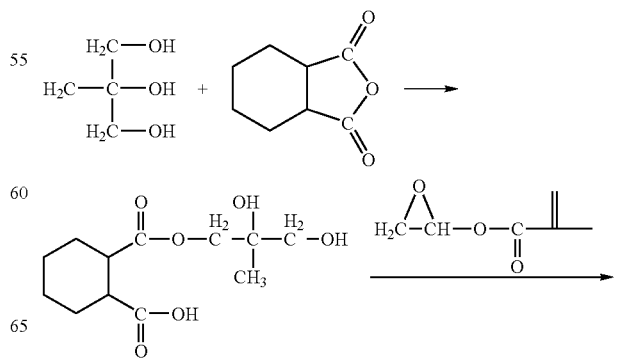

-continued

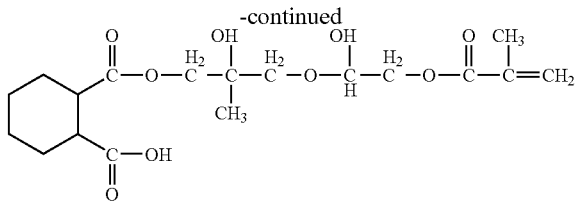

In another embodiment, the photopolymerizable monomer may be glycerol methacrylate represented by the following Formula 2.

[Chemical Formula 2]

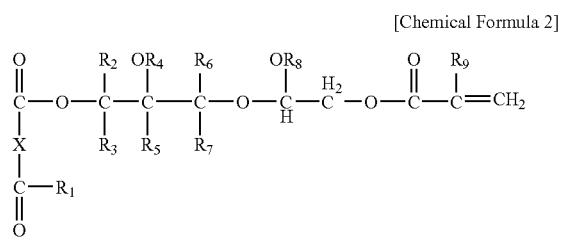

In the above Formula 2, X is selected from the group consisting of substituted or unsubstituted alkylene, substituted or unsubstituted cycloalkylene, substituted or unsubstituted alkenylene, substituted or unsubstituted arylene, and substituted or unsubstituted divalent heterocycle. In exemplary embodiments, X is selected from the group consisting of cyclopropylene, cyclopentylene, cyclohexylene, 2-butenylene, p-phenylene, naphthylene, 2,3-tetrazol-diyl, 1,3-triazole-diyl, 1,5-benzimidazole-diyl, 2,5-benzothiazole-diyl, 2,5-pyrimidine-diyl, 3-phenyl-2,5-tetrazol-diyl, 2,5-pyridine-diyl, 2,4-furan-diyl, 1,3-piperidine-diyl, 2,4-morpholine-diyl, 1,2-thiophene-diyl, 1,4-thiophene-diyl, and the like.

At least one hydrogen of the alkylene, cycloalkylene, alkenylene, arylene, and divalent heterocycle may be substituted by a substituent selected from the group consisting of halogen (F, Br, Cl, or I); hydroxy; nitro; cyano; amino; azido, amidino, hydrazino, hydrazono, carbonyl, carbamyl, thiol, ester, carboxyl or a salt thereof; sulfonic acid or a salt thereof; phosphoric acid or a salt thereof; substituted or unsubstituted $C_1$-$C_{15}$ alkyl such as methyl, ethyl, propyl, isopropyl, or isobutyl; substituted or unsubstituted $C_1$-$C_{20}$ alkoxy such as methoxy, ethoxy, propoxy, or butoxy; substituted or unsubstituted $C_2$-$C_{16}$ alkenyl such as vinyl, propenyl, or butenyl; substituted or unsubstituted $C_2$-$C_{16}$ alkynyl such as ethynyl; substituted or unsubstituted $C_6$-$C_{18}$ aryl such as phenyl, naphthyl, tetrahyrdronaphthyl, indan, cyclopentadienyl, or biphenyl; substituted or unsubstituted $C_7$-$C_{18}$ arylalkyl such as benzyl or phenylethyl; substituted or unsubstituted $C_1$-$C_{20}$ heteroalkyl including nitrogen, sulfur, oxygen, or phosphorus; substituted or unsubstituted $C_2$-$C_{20}$ heterocycle that is a $C_4$ to $C_{20}$ cyclic radical including 1, 2, or 3 heteroatoms selected from the group consisting of nitrogen, sulfur, oxygen, and phosphorus, for example thienyl, puryl, benzothienyl, pyridyl, pyrazinyl, or pyrimidinyl; substituted or unsubstituted $C_3$-$C_{20}$ heteroarylalkyl; substituted or unsubstituted $C_3$-$C_{15}$ cycloalkyl; substituted or unsubstituted $C_3$-$C_{15}$ cycloalkenyl; substituted or unsubstituted $C_6$-$C_{15}$ cycloalkynyl; and substituted or unsubstituted $C_3$-$C_{20}$ heterocycloalkyl such as aziridinyl, pyrrolidinyl or piperidinyl.

In the above Formula 2, $R_1$ to $R_9$ are independently hydrogen or alkyl, for example hydrogen or methyl.

When glycerol methacrylate represented by Formula 2 is used as a photopolymerizable monomer, cross linkage can progress through a cross-linking reaction initiated by the photoinitiator, and it can facilitate development of a non-exposed portion since it has a carboxyl group in the molecule, so the pattern residue characteristics can be improved.

According to one embodiment, the (b) photopolymerizable monomer has a weight average molecular weight (Mw) ranging from 500 to 3000, for example a weight average molecular weight (Mw) from 1000 to 2000.

The photosensitive resin composition includes the (b) photopolymerizable monomer in an amount of 0.5 to 20 wt % based on the total weight of the photosensitive resin composition. When the photopolymerizable monomer is added in an amount within this range, the developing property of the alkali developer can be improved to provide the pattern with clear corners.

(c) Photopolymerization Initiator

The photopolymerization initiator may be any conventional photopolymerization initiator known in the art that is generally used in photosensitive resin compositions, for example a triazine-based compound, an acetophenone-based compound, a benzophenone-based compound, a thioxanthone-based compound, a benzoin-based compound, and the like.

Examples of the triazine-based compound include 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, bis(trichloro methyl)-6-styryl-s-triazine, 2-(naphto 1-yl)-4,6-bis(trichloro methyl)-s-triazine, 2-(4-methoxy naphto 1-yl)-4,6-bis (trichloro methyl)-s-triazine, 2,4-trichloro methyl(piperonyl)-6-triazine, 2,4-trichloro methyl (4'-methoxy styryl)-6-triazine, and the like.

Examples of the acetophenone-based compound include 2,2'-diethoxyacetophenone, 2,2'-dibutoxyacetophenone, 2-hydroxy-2-methylpropiophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound include benzophenone, benzoyl benzoic acid, benzoyl methyl benzoate, 4-phenyl benzophenone, hydroxy benzophenone, acrylated benzophenone, 4,4'-bis(dimethyl amino)benzophenone, 4,4'-bis(diethyl amino)benzophenone, 4,4'-dimethylaminobenzophenone, 4,4'-dichlorobenzophenone, 3,3'-dimethyl-2-methoxybenzophenone, and the like.

Examples of the thioxanthone-based compound include thioxanthone, 2-crolthioxanthone, 2-methylthioxanthone, isopropyl thioxanthone, 2,4-diethyl thioxanthone, 2,4-diisopropyl thioxanthone, 2-chloro thioxanthone, and the like.

Examples of the benzoin-based compound include benzoin, benzoin methyl ether, benzoin ethyl ether, benzoin isopropyl ether, benzoin isobutyl ether, benzyldimethylketal, and the like.

Other examples of the photopolymerization initiator may include carbazole-based compounds, diketone-based compounds, sulfonium borate-based compounds, diazo-based compounds, biimidazole-based compounds, and the like.

In an exemplary embodiment, the (c) photopolymerization initiator includes a triazine-based compound. According to one embodiment, the triazine-based compound has a maximum photo-absorption wavelength (λmax) ranging from 340 to 380 nm, which can affect the pixel pattern performance.

Exemplary triazine-based compounds include at least one of 2-piperonyl-4,6-bis(trichloromethyl)-1,3,5-triazine (TPP), 2-[4-(4-ethylphenyl)phenyl]-4,6-bis(trichloromethyl)-1,3,5-triazine (STR-2BP), 2-(2-methoxyphenyl)ethylene-4,6-bis(trichloromethyl)-1,3,5-triazine (TOMS), and 2-(4-methoxyphenyl)ethylene-4,6-bis(trichloromethyl)-1,3,5-triazine (TPMS).

According to one embodiment, the photosensitive resin composition can include the photopolymerization initiator in an amount of 0.1 to 10 wt % based on the total weight of the photosensitive resin composition. When the photopolymerization initiator is added in an amount within this range, it can be possible to carry out sufficient photopolymerization upon exposure, and deterioration of the transmittance due to non-reacted initiator after photopolymerization can be avoided.

(d) Pigment

Examples of the (d) pigment may include red, green, blue, yellow, and violet color pigments. Although a single anthraquinone-based pigment, a condensed polycyclic pigment of a pherylene base, a phthalocyanine pigment, an azo-based pigment, and the like may be employed, a combination of at least two thereof can be used in order to adjust the maximum adsorption wavelength, cross point, and crosstalk.

The pigment may be included as a dispersion in a photosensitive resin composition. Exemplary dispersing solvents for the dispersion of the pigment may include alkylene glycol acetates such as ethylene glycol acetate; alkylene glycol ether acetates such as propylene glycol methyl ether acetate; cellosolves such as ethyl cellosolve; alkylesters such as ethyl lactate; polyalkylene glycols such as polyethylene glycol; ketones such as cyclohexanone; and alkylene glycols such as propylene glycol methylether. The above solvents may be used singly or in combination. In an exemplary embodiment, propylene glycol methyl ether acetate may be used.

A dispersing agent may be used to uniformly disperse the pigment in the dispersing solvent. The dispersing agent may be a non-ionic, anionic, or cationic dispersing agent. For example, the dispersing agent may be polyalkylene glycol or an ester thereof, a polyoxyalkylene, a polyhydric alcohol ester alkylene oxide addition product, an alcohol alkyleneoxide addition product, a sulfonic acid ester, a sulfonic acid salt, a carboxylic acid ester, a carboxylic acid salt, an alkylamidealkylene oxide addition product, an alkylamine, and the like. In addition, it may include a dispersing agent such as disperbyl 2001® (manufactured by BYK), which is commercially available. These dispersing agents may be used singly or in a combination of two or more with an appropriate ratio.

It is possible to improve the pixel patterning property as well as the stability of the pigment dispersion by further adding an acrylic resin including a carboxylic group together with the dispersing agent. The acrylic-based resin including a carboxylic group may include the (a) acrylic-based resin.

According to one embodiment, the pigment has a primary particle diameter ranging from 10 to 80 nm. According to another embodiment, the pigment has a primary particle diameter ranging from 10 to 70 nm. When the primary particle diameter is within the above ranges, it can improve stability in the dispersion and deterioration of the pixel resolution can be avoided.

The secondary particle diameter of the (d) pigment that is dispersed in the dispersion is not specifically limited. For example, the secondary particle diameter can be less than 200 nm taking into account the pixel resolution. According to another embodiment, the secondary particle diameter can range from 70 to 100 nm.

The photosensitive resin composition includes the (d) pigment in an amount of 0.1 to 50 wt % based on the total amount of the photosensitive resin composition. When the pigment is added in an amount within this range, it can provide an excellent coloring effect and developing property.

(e) Solvent

Exemplary solvents includes alkylene glycol acetates such as ethylene glycol acetate; alkylene glycol ether acetates such as propylene glycol methylether acetate; cellosolves such as ethyl cellosolve; alkyl esters such as ethyl lactate; polyalkylene glycols such as polyethylene glycol; ketones such as cyclohexanone; alkylene glycols such as propylene glycol methylether; ethylene glycols such as ethylene glycol, diethylene glycol, and the like; ethylene glycol monomethyl ether; diethylene glycol monomethyl ether; ethylene glycol diethylether; glycol ethers such as diethylene glycol dimethyl ether; glycol ether acetates such as ethylene glycol monoethyl ether acetate, diethylene glycol monoethyl ether acetate, diethylene glycol monobutylether acetate, and the like; propylene glycols such as propylene glycol; propylene glycol ethers such as propylene glycol monomethylether, propylene glycol monoethylether, propylene glycol monopropylether, propylene monobutylether, propylene glycol dimethylether, dipropylene glycol dimethylether, propylene glycol diethylether, dipropylene glycol diethylether, and the like; propylene glycol ether acetates such as propylene glycol monomethylether acetate, dipropylene glycol monoethyl ether acetate, and the like; amides such as N-methylpyrrolidone, dimethyl formamide, dimethyl acetamide, and the like; ketones such as methyl ethyl ketone (MEK), methyl isobutyl ketone (MIBK), cyclohexanone, and the like; petroleums such as toluene, xylene, a naphtha solvent, and the like; and esters such as ethyl acetate, butyl acetate, ethyl lactate, and the like. The solvent may be used singly or in combination. In the above solvents, the term "alkylene" refers to a C2 to C20 alkylene, and "alkyl" refers to a C1 to C10 alkyl.

The (e) solvent is added to balance the remaining amount in the photosensitive resin composition. According to one embodiment, the solvent is added in an amount of 20 to 90 wt % based on the total amount of photosensitive resin composition. When the solvent is added in an amount within this range, it can provide a photosensitive resin composition with an excellent coating property and it can maintain flatness even in a membrane having a thickness of 1 μm or more.

(f) Other Additives

In addition to these components mentioned in (a) to (e), the photosensitive resin composition for a color filter may further include additional additives such as malonic acid, oxalic acid, succinic acid, itaconic acid, 3-amino-1,2-propanediol, or a fluorine-based surfactant in order to prevent stains or spots upon coating, to adjust leveling, or to prevent pattern residues due to non-development.

Exemplary surfactants may include fluorine-based surfactants such as Megaface F142D, F172, F-172D, F177P, F-470, F-471, and F-475 manufactured by Dainippon Ink.

The photosensitive resin composition can include the additional additives in an amount of 0.1 to 0.5 wt % based on the total weight of the photosensitive resin composition.

According to another embodiment of the present invention, provided is a color filter prepared by using the photosensitive resin composition.

The color filter can be prepared by coating a photosensitive resin composition on a wafer by an appropriate method such as spin coating or slit coating to a thickness ranging from 0.5 to 1 μm; irradiating the coated photosensitive resin composition in a pattern required for the color filter; and treating the same with an alkali developer to dissolve a non-exposed part and to provide a color filter having the pattern required for the color filter. The substrate can be silicon oxide ($SiO_2$) or silicon nitride ($SiN_x$), and the light source for the irradiation process may include 365 nm I-line light.

The process may be repeated in accordance with required numbers of R, G, and B to provide a color filter having desired patterns. The obtained image pattern may be hardened by reheating or irradiating active rays thereto to improve crack resistance and solvent resistance.

The color filter fabricated using the photosensitive resin composition according to one embodiment of the present invention enables provision of a fine square-shaped pattern having a pixel size of 1.2×1.2 μm. As a result, the color filter fabricated using the photosensitive resin composition can show a high resolution when it is applied to an image sensor.

In addition, the photosensitive resin composition can be useful when the lower material of the color filter similar to the passivation layer or IMD layer includes $SiO_2$ or $SiN_x$. An image sensor including a color filter fabricated using the photosensitive resin composition can omit an overcoating layer, a passivation layer, or both under the color filter, so that the distance between the microlens and the photodiode can be decreased.

Figure 3:
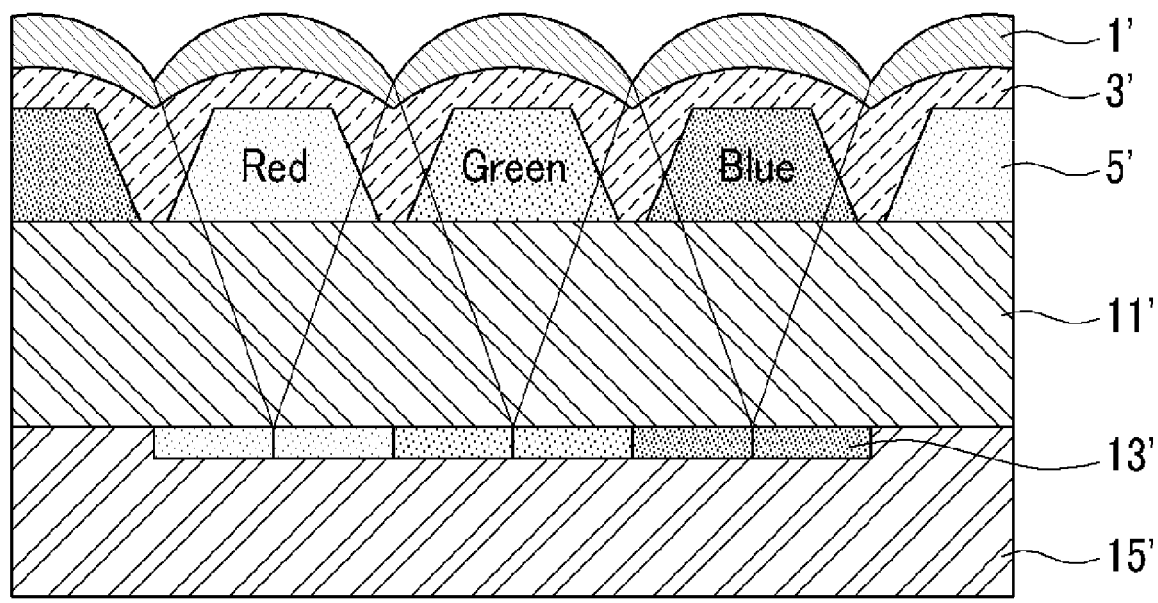
FIG. 3 is a schematic view of a complementary metal oxide semiconductor (CMOS) image sensor including an image sensor color filter according to one embodiment of the present invention.
Figure 4:
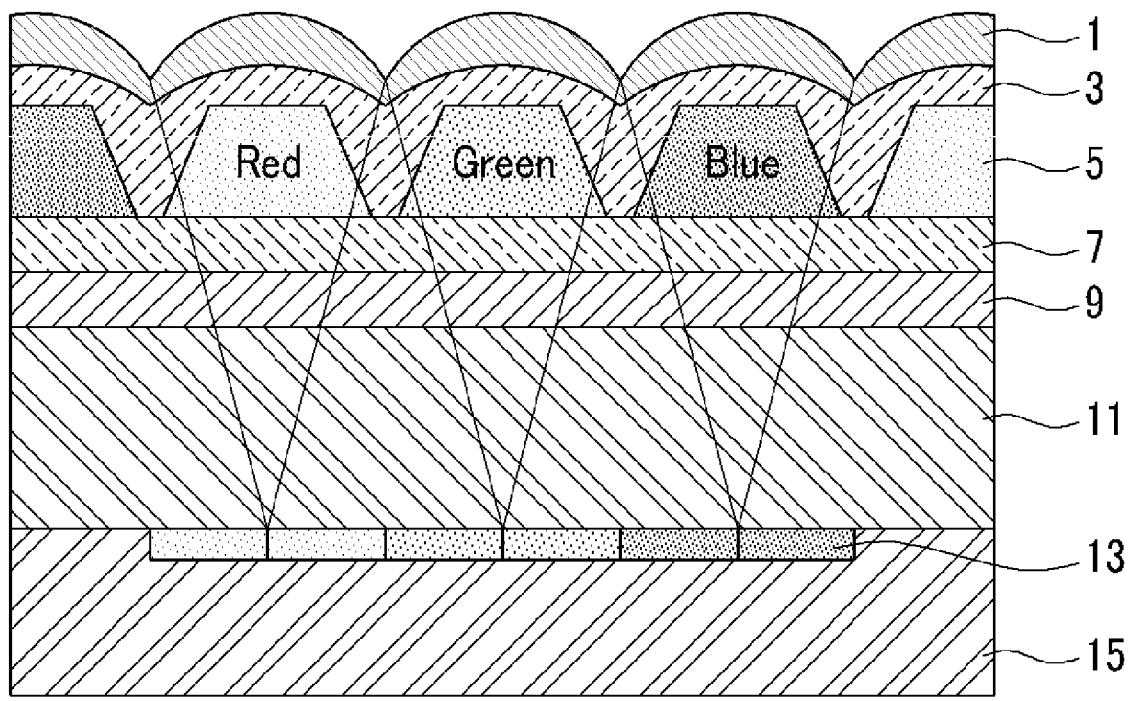
FIG. 4 is a schematic view of a conventional complementary metal oxide semiconductor (CMOS) image sensor.

FIG. 3 shows a structure of an image sensor in which an overcoating layer and a passivation layer are omitted.

FIG. 3 is a schematic view of a complementary metal oxide semiconductor (CMOS) image sensor including an image sensor color filter according to one embodiment of the present invention.

As shown in FIG. 3, a complementary metal oxide semiconductor (CMOS) image sensor 200 including an image sensor color filter according to one embodiment of the present invention has a structure in which the first overcoating layer 7 and the passivation layer 9 are omitted from the complementary metal oxide semiconductor image sensor. It includes an overcoating layer 3' and color filter 5' under the microlens 1'; an inter-metal insulation layer 11' under the color filter 5'; and a photodiode 13' and an interlayer insulating layer 15' under the inter metal insulation layer 11'.

The following examples illustrate the present invention in more detail. However, it is understood that the present invention is not limited by these examples.

Example 1

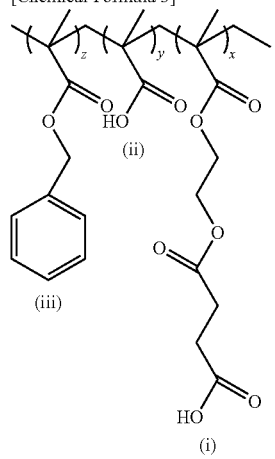

(a) Acrylic-based resin of the following Formula 3           5.0 g
[Chemical Formula 3]

x/y/z = 5/10/85 (mol %), molecular weight (Mw) = 15,000
(i): Repeating unit derived from ethoxy 4-oxo butanoic methacrylate
(ii): Repeating unit derived from methacrylic acid
(iii): Repeating unit derived from benzylmethacrylate
(b) Photopolymerizable monomer

| | |
|---|---|
| Dipentaerythritol hexaacrylate (DPHA) | 2.9 g |
| Glycerol methacrylate (GMA, molecular weight 1500) | 1.2 g |

-continued

| | |
|---|---|
| (c) Photopolymerization initiator | |
| TPP (produced by Ciba Specialty Chemicals) | 0.2 g |
| (d) Pigment dispersion | 46.8 g |
| Red (BT-CF produced by Ciba Specialty Chemicals) | (6.2 g) |
| Yellow (2RP-CF produced by Ciba Specialty Chemicals) | (2.8 g) |
| Dispersing agent (disperbyk 2001 produced by BYK) | (2.4 g) |
| Acrylic-based resin in (a) | (5.4 g) |
| Solvent (PGMEA) | (30.0 g) |
| (e) Solvent | |
| Propylene glycol monomethyl ether acetate | 20.0 g |
| Ethylethoxy propionate | 23.8 g |
| (f) Additive | |
| F-475 (fluorine-based surfactant) | 0.1 g |

Using the above components, a photosensitive resin composition is prepared as follows.

(1) The photopolymerization initiator is dissolved in the solvent, and then agitated for 2 hours at room temperature.

(2) The acrylic-based resin and the photopolymerizable monomer are added and then agitated for 2 hours at room temperature.

(3) The pigment dispersion is added and then agitated for 1 hour at room temperature.

(4) The surfactant is added and then agitated for 1 hour at room temperature.

(5) The resultant product is filtered twice to remove impurities.

After the composition is coated on a 6-inch wafer deposited with 1000 Å $SiO_2$ by a spin coater (1H-DX2) manufactured by Mikasa, it is dried at 100° C. for 180 seconds. Then, it is exposed at 250 ms by an I-line stepper manufactured by Nikon to form various reticular patterns, and developed with a 2.38% TMAH solution at room temperature for 120 seconds. The developed substrate is cleaned and dried at a high temperature of 200° C. for 300 seconds to provide a color filter.

Examples 2 to 8

Color filters are fabricated according to the same method as in Example 1, except that an (a) acrylic-based resin and a (b) photopolymerization monomer are used as shown in the following Table 1.

Examples 9 to 11

A color filter is fabricated in accordance with the same procedure as in Example 1, except that an (a) acrylic-based resin and a (b) photopolymerization monomer as shown in the following Table 1 are used, and a wafer deposited with $SiN_x$ instead of $SiO_2$ is used.

Comparative Examples 1 and 2

A color filter is fabricated in accordance with the same procedure as in Example 1, except that the acrylic-based resin is a two-component copolymer including benzyl methacrylate and methacrylic acid, the photopolymerization monomer is dipentaerythritol hexamethacrylate (DPHA), and the wafer membrane material is changed.

TABLE 1

| | (a) Acrylic-based resin | | | | | (b) | |
|---|---|---|---|---|---|---|---|
| | (i) repeating unit derived from the ethylenic unsaturated monomer having an ethoxy 4-oxo butanoic acid group (mol %) | (ii) repeating unit derived from methacrylic acid (mol %) | (iii) repeating unit derived from the ethylenic unsaturated monomer (mol %) | Acid value (mgKOH/g) | Weight average Molecular weight | Photopolymerizable monomer (weight ratio) | Wafer for color filter |
| Example 1 | 5 | 10 | benzyl methacrylate (85) | 70 | 15,000 | DPHA + GMA (7/3) | $SiO_2$ |
| Example 2 | 5 | 20 | benzyl methacrylate (75) | 100 | 15,000 | DPHA | $SiO_2$ |
| Example 3 | 5 | 20 | benzyl methacrylate (75) | 100 | 15,000 | GMA | $SiO_2$ |
| Example 4 | 5 | 20 | benzyl methacrylate (75) | 100 | 15000 | DPHA + GMA (7/3) | $SiO_2$ |
| Example 5 | 5 | 10 | benzyl methacrylate (85) | 100 | 35,000 | DPHA + GMA (7/3) | $SiO_2$ |
| Example 6 | 10 | 25 | benzyl methacrylate (65) | 130 | 15,000 | DPHA + GMA (7/3) | $SiO_2$ |
| Example 7 | 5 | 20 | styrene (75) | 100 | 15,000 | DPHA + GMA (7/3) | $SiO_2$ |
| Example 8 | 5 | 20 | n-phenyl malemide (75) | 100 | 25,000 | DPHA + GMA (7/3) | $SiO_2$ |
| Example 9 | 5 | 25 | benzyl methacrylate (75) | 100 | 15,000 | DPHA + GMA (7/3) | $SiN_x$ |
| Example 10 | 5 | 20 | styrene (75) | 100 | 15,000 | DPHA + GMA (7/3) | $SiN_x$ |
| Example 11 | 5 | 20 | n-phenyl malemide (75) | 100 | 25,000 | DPHA + GMA (7/3) | $SiN_x$ |
| Comparative Example 1 | — | 25 | benzyl methacrylate (75) | 100 | 15,000 | DPHA | $SiO_2$ |
| Comparative Example 2 | — | 25 | benzyl methacrylate (75) | 100 | 15,000 | DPHA | $SiN_x$ |

Note:
DPHA: Dipentaerythritol hexamethacrylate,
GMA: Glycerol methacrylate

Experimental Example

The color filters obtained from Example 8 and Comparative Example 1 are measured for a cross-section of pattern with a scanning electron microscope (SEM). The results are shown in FIG. 1A, FIG. 1B, FIG. 2A, and FIG. 2B.

Figure 1B:
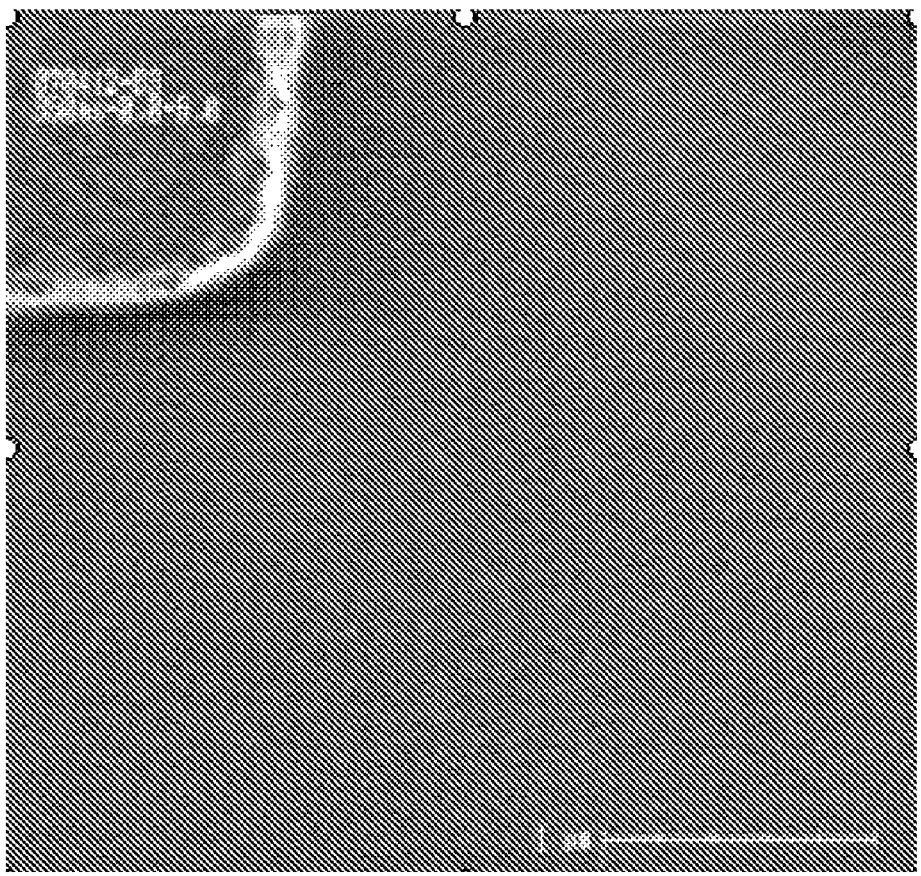
FIG. 1B is a view of FIG. 1A enlarged twenty (20) times.
Figure 2A:
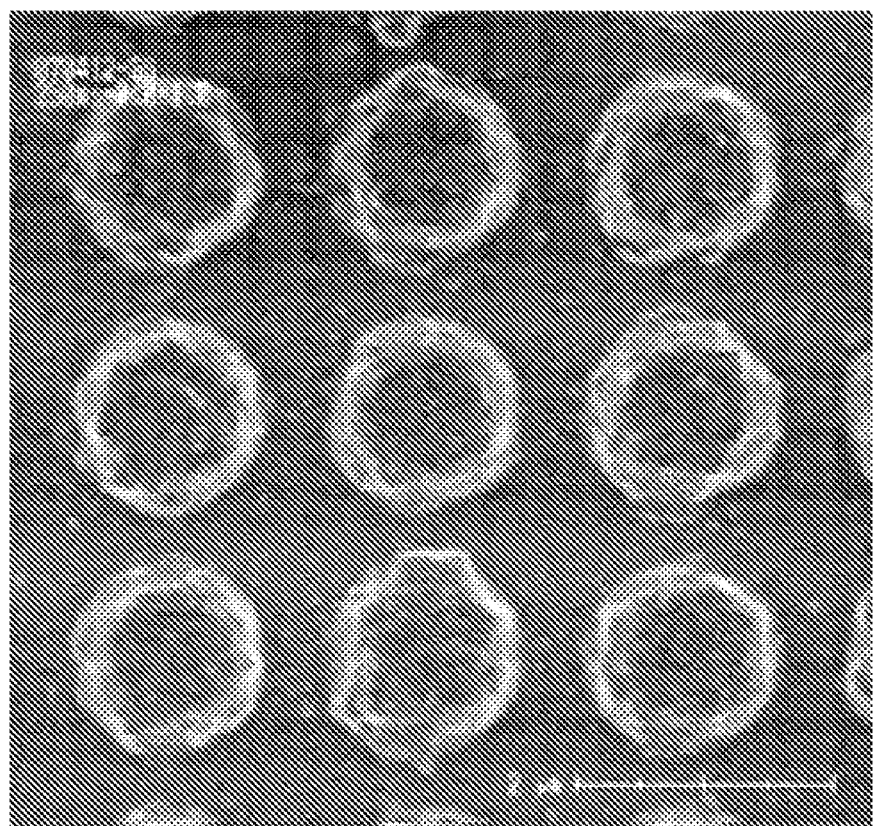
FIG. 2A is a photograph of a pixel fabricated using the photosensitive resin composition for a color filter according to Comparative Example 1.
Figure 2B:
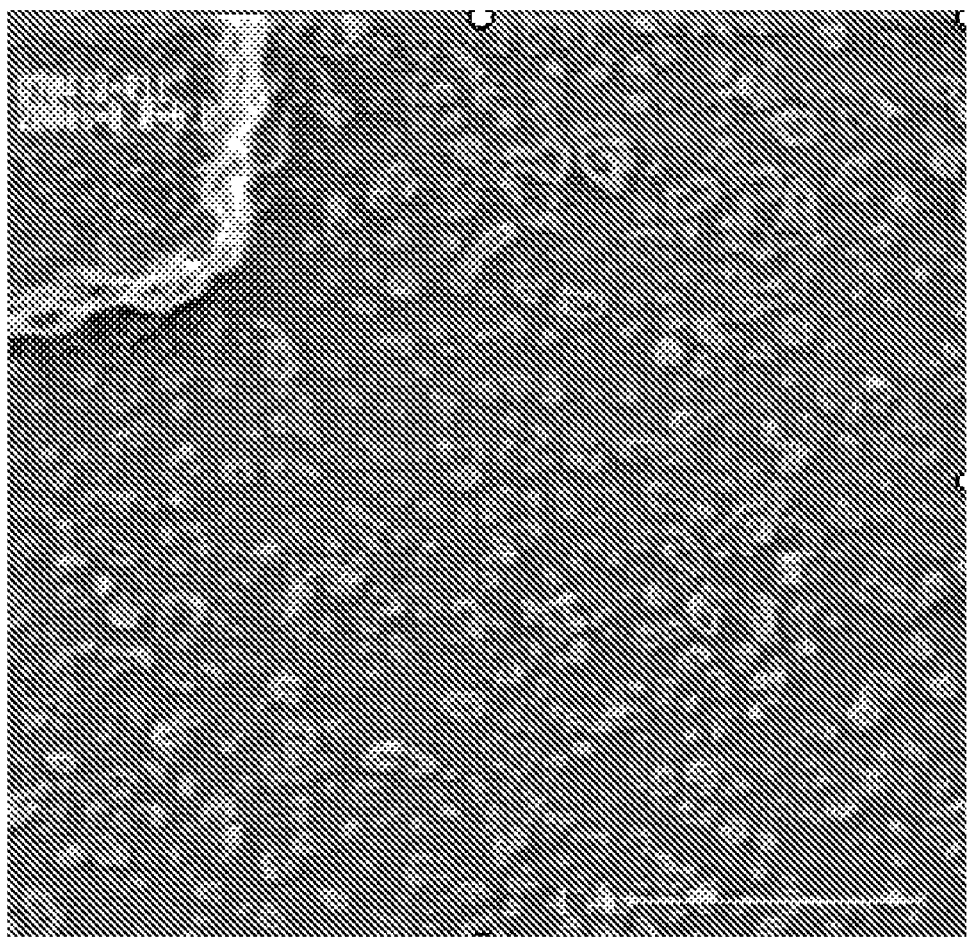
FIG. 2B is a view of FIG. 2A enlarged twenty (20) times.

FIG. 1A is a photograph of a pixel fabricated using the photosensitive resin composition for a color filter according to Example 8, and FIG. 1B is a view of FIG. 1A enlarged 20 times. FIG. 2A is a photograph of a pixel fabricated using the photosensitive resin composition for a color filter according to Comparative Example 1, and FIG. 2B is a view of FIG. 2A enlarged 20 times.

As shown in FIG. 1A to 2B, the color filter according to Example 8 that is fabricated using a photosensitive resin composition including acrylic acid having a side chain of a carboxyl group and ethoxy 4-oxo butanoic acid provides a pixel having square patterns and no pattern residue in the non-exposed part, while the color filter according to Comparative Example 1 provides a pixel having imperfect patterns and a lot of pattern residue.

Pixels fabricated using the photosensitive resin compositions according to Examples 1 to 11 and Comparative Examples 1 and 2 are measured for pattern profile, pattern residue, close contacting property, and resolution. The results are shown in the following Table 2.

The pattern resolution is measured with an optical microscope, and the coating thickness is measured by T4000-DLX equipment manufactured by KMAC.

1) Profile Analysis

After being exposed to a light source at 365 nm from an i-10C exposer (manufactured by Nikon) installed with photomasks having various sizes of squares, it is developed with a 0.19% TMAH solution, and the obtained pixel pattern (1.5× 1.5 μm square) is observed for pattern cross-section with a CD-SEM (S-9260-A) manufactured by Hitachi. A profile having a good rectangular shape is evaluated as 0; a slightly round shape is evaluated as; and a full round shape is evaluated as X.

2) Pattern Residue

The obtained pixel pattern (1.5×1.5 μm square) is monitored for a pattern flat face by a CD-SEM (S-9260-A) manufactured by Hitachi. When pattern residue is not reported on a non-exposed part, it is evaluated as O; when it is slightly reported, it is evaluated as; and when it is certainly reported, it is evaluated as X.

3) Resolution

The obtained pixel patterns are measured for a size of distinguishable minimum pixel.

TABLE 2

| | Pixel pattern | | |
|---|---|---|---|
| | Profile | Residue | Resolution (μm) |
| Example 1 | ◯ | | 1.0 × 1.0 |
| Example 2 | ◯ | | 1.0 × 1.0 |
| Example 3 | | ◯ | 1.0 × 1.0 |
| Example 4 | ◯ | ◯ | 1.0 × 1.0 |
| Example 5 | ◯ | ◯ | 1.2 × 1.2 |
| Example 6 | | ◯ | 1.0 × 1.0 |
| Example 7 | ◯ | ◯ | 1.0 × 1.0 |
| Example 8 | ◯ | ◯ | 1.0 × 1.0 |
| Example 9 | ◯ | ◯ | 1.0 × 1.0 |
| Example 10 | ◯ | ◯ | 1.0 × 1.0 |
| Example 11 | ◯ | ◯ | 1.0 × 1.0 |
| Comparative Example 1 | X | X | 2.0 × 2.0 |
| Comparative Example 2 | X | X | 2.0 × 2.0 |

As shown in Table 2, pixels of color filters obtained from Examples 1 to 11 have a pattern having a fine square and no pattern residue in non-exposure portions compared to those of Comparative Examples 1 and 2.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter comprising:
   (a) an acrylic-based resin; (b) a photopolymerizable monomer, wherein (b) the photopolymerizable monomer is glycerol methacrylate obtained from a reaction of glycerol, acid anhydride, and glycidyl methacrylate; (c) a photopolymerization initiator; (d) a pigment; and (e) a solvent,
   wherein the acrylic-based resin is a copolymer including a repeating unit derived from an ethylenic unsaturated monomer including a carboxyl group and a repeating unit derived from an ethylenic unsaturated monomer including an alkoxy 4-oxo butanoic acid group.

2. The photosensitive resin composition of claim 1, wherein the composition comprises: (a) 0.5 to 20 wt % of an acrylic-based resin; (b) 0.5 to 20 wt % of a photopolymerizable monomer; (c) 0.1 to 10 wt % of a photopolymerization initiator; (d) 0.1 to 50 wt % of a pigment dispersion; and (e) balance of a solvent.

3. The photosensitive resin composition of claim 1, wherein the acrylic-based resin is a copolymer of i) an ethylenic unsaturated monomer having an alkoxy 4-oxo butanoic acid group, ii) an ethylenic unsaturated monomer having a carboxyl group, and iii) an ethylenic unsaturated monomer that is copolymerizable with the ethylenic unsaturated monomer having the alkoxy 4-oxo butanoic acid group or a carboxyl group.

4. The photosensitive resin composition of claim 3, wherein the ethylenic unsaturated monomer having an alkoxy 4-oxo butanoic acid group is selected from the group consisting of ethoxy 4-oxo butanoic methacrylate, ethoxy 4-oxo butanoic acrylate, propoxy 4-oxo butanoic methacrylate, propoxy 4-oxo butanoic acrylate, butoxy 4-oxo butanoic methacrylate, butoxy 4-oxo butanoic acrylate, and mixtures thereof.

5. The photosensitive resin composition of claim 3, wherein the (a) acrylic-based resin comprises a repeating unit derived from the ethylenic unsaturated monomer having an alkoxy 4-oxo butanoic acid group in an amount of 1 to 20 mol %.

6. The photosensitive resin composition of claim 3, wherein the ethylenic unsaturated monomer having a carboxyl group is selected from the group consisting of acrylic acid, alkoxy 4-oxo butanoic acid, methacrylic acid, maleic acid, itaconic acid, fumaric acid, and mixtures thereof.

7. The photosensitive resin composition of claim 3, wherein the (a) acrylic-based resin comprises a repeating unit derived from the ethylenic unsaturated monomer having a carboxyl group in an amount of 10 to 40 mol % along with the repeating unit derived from the ethylenic unsaturated monomer having an alkoxy 4-oxo butanoic acid group.

8. The photosensitive resin composition of claim 3, wherein the iii) ethylenic unsaturated monomer that is copolymerizable with the ethylenic unsaturated monomer having the alkoxy 4-oxo butanoic acid group or a carboxyl group includes a vinyl aromatic compound, an unsaturated carbonic acid ester, an unsaturated carbonic acid amino alkyl ester, a carbonic acid vinyl ester, an unsaturated carbonic acid glycidyl ester, a vinyl cyanide compound, an unsaturated amide, or a mixture thereof.

9. The photosensitive resin composition of claim 3, wherein the (a) acrylic-based resin comprises a repeating unit derived from the ethylenic unsaturated monomer that is copolymerizable with the ethylenic unsaturated monomer having the alkoxy 4-oxo butanoic acid group or a carboxyl group in an amount of 60 to 90 mol %.

10. The photosensitive resin composition of claim 3, wherein the (a) acrylic-based resin is a copolymer of the structure of the following Formula 1:

[Chemical Formula 1]

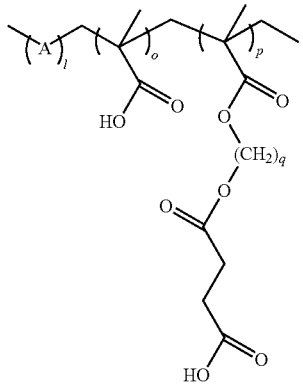

wherein A is a repeating unit derived from the iii) ethylenic unsaturated monomer that is copolymerizable with the ethylenic unsaturated monomer having the alkoxy 4-oxo butanoic acid group or a carboxyl group; l, o, and p represent a mole ratio (mol %) of each repeating unit; and q is an integer ranging from 1 to 4.

11. The photosensitive resin composition of claim 1, wherein the (a) acrylic-based resin has a weight average molecular weight of 5000 to 60,000.

12. The photosensitive resin composition of claim 1, wherein the (a) acrylic-based resin has an acid value of 70 to 130 mg KOH/g.

13. The photosensitive resin composition of claim 1, wherein the (b) photopolymerizable monomer is glycerol methacrylate of the following Formula 2:

[Chemical Formula 2]

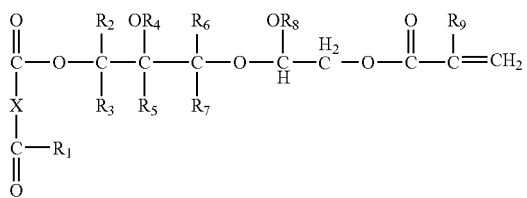

wherein, in the above formula, X is selected from the group consisting of substituted or unsubstituted alkylene, substituted or unsubstituted cycloalkylene, substituted or unsubstituted alkenylene, substituted or unsubstituted arylene, and substituted or unsubstituted divalent heterocycle; and R1 to R9 are independently hydrogen or alkyl.

14. The photosensitive resin composition of claim 1, wherein the (b) photopolymerizable monomer has a weight average molecular weight (Mw) of 500 to 3000.

15. The photosensitive resin composition of claim 1, wherein the photopolymerization initiator is selected from the group consisting of triazine-based compounds, acetophenone-based compounds, benzophenone-based compounds, thioxanthone-based compounds, benzoin-based compounds, and mixtures thereof.

16. The photosensitive resin composition of claim 1, wherein the pigment has a primary particle diameter of 10 to 80 nm.

17. The photosensitive resin composition of claim 1, wherein the photosensitive resin composition further comprises an additive selected from the group consisting of malonic acid, oxalic acid, succinic acid, itaconic acid, 3-amino-1,2-propanediol, fluorine-based surfactants, and mixtures thereof.

18. A color filter fabricated using the photosensitive resin composition for a color filter according to claim 1.

* * * * *

UNITED STATES PATENT AND TRADEMARK OFFICE
CERTIFICATE OF CORRECTION

| | |
|---|---|
| PATENT NO. | : 8,263,675 B2 |
| APPLICATION NO. | : 12/717418 |
| DATED | : September 11, 2012 |
| INVENTOR(S) | : Kil-Sung Lee et al. |

Page 1 of 1

It is certified that error appears in the above-identified patent and that said Letters Patent is hereby corrected as shown below:

At Column 15, Lines 1-2 reads: "having a good rectangular shape is evaluated as Ө; a slightly round shape is evaluated as; and a full round shape is evalu-"

and should read: "having a good rectangular shape is evaluated as O; a slightly round shape is evaluated as □ ; and a full round shape is evalu-"

At Column 15, Table 2, is incorrectly depicted by the omission of the symbols for a slightly round shape and should be depicted as:

| | Pixel pattern | | |
|---|---|---|---|
| | Profile | Residue | Resolution (μm) |
| Example 1 | O | □ | 1.0 x 1.0 |
| Example 2 | O | □ | 1.0 x 1.0 |
| Example 3 | □ | O | 1.0 x 1.0 |
| Example 4 | O | O | 1.0 x 1.0 |
| Example 5 | O | O | 1.2 x 1.2 |
| Example 6 | □ | O | 1.0 x 1.0 |
| Example 7 | O | O | 1.0 x 1.0 |
| Example 8 | O | O | 1.0 x 1.0 |
| Example 9 | O | O | 1.0 x 1.0 |
| Example 10 | O | O | 1.0 x 1.0 |
| Example 11 | O | O | 1.0 x 1.0 |
| Comparative Example 1 | X | X | 2.0 x 2.0 |
| Comparative Example 2 | X | X | 2.0 x 2.0 |

Signed and Sealed this
Twelfth Day of February, 2013

Teresa Stanek Rea
*Acting Director of the United States Patent and Trademark Office*